(12) United States Patent
Weiss

(10) Patent No.: US 8,509,875 B2
(45) Date of Patent: Aug. 13, 2013

(54) PROCESS FOR LOCATING A MEDICAL INSTRUMENT WITH A MICROCOIL

(75) Inventor: Steffen Weiss, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 224 days.

(21) Appl. No.: 10/571,523

(22) PCT Filed: Sep. 2, 2004

(86) PCT No.: PCT/IB2004/051674
§ 371 (c)(1),
(2), (4) Date: Mar. 10, 2006

(87) PCT Pub. No.: WO2005/026762
PCT Pub. Date: Mar. 24, 2005

(65) Prior Publication Data
US 2006/0281988 A1    Dec. 14, 2006

(30) Foreign Application Priority Data
Sep. 12, 2003  (EP) ..................................... 03103366

(51) Int. Cl.
*A61B 5/055* (2006.01)
(52) U.S. Cl.
USPC ........................................ 600/423; 600/424
(58) Field of Classification Search
USPC ................ 600/411, 423, 424; 324/307, 309, 324/318, 322
See application file for complete search history.

(56) References Cited

U.S. PATENT DOCUMENTS

| | | | | |
|---|---|---|---|---|
| 5,735,795 A * | 4/1998 | Young et al. | ................... | 600/410 |
| 6,087,831 A * | 7/2000 | Bornert et al. | ................. | 324/307 |
| 6,236,205 B1 * | 5/2001 | Ludeke et al. | ................. | 324/318 |
| 6,275,722 B1 * | 8/2001 | Martin et al. | .................. | 600/410 |
| 6,280,385 B1 * | 8/2001 | Melzer et al. | ................. | 600/423 |
| 6,397,094 B1 * | 5/2002 | Ludeke et al. | ................. | 600/411 |
| 6,512,941 B1 * | 1/2003 | Weiss et al. | .................... | 600/410 |
| 6,957,098 B1 * | 10/2005 | Hyde et al. | ..................... | 600/424 |
| 7,162,293 B2 * | 1/2007 | Weiss | ........................... | 600/411 |
| 2001/0040449 A1 * | 11/2001 | Schaffter et al. | .............. | 324/224 |
| 2003/0088181 A1 * | 5/2003 | Gleich | .......................... | 600/434 |
| 2003/0135110 A1 * | 7/2003 | Leussler | ....................... | 600/422 |
| 2004/0127787 A1 * | 7/2004 | Dimmer et al. | ............... | 600/424 |
| 2006/0052692 A1 * | 3/2006 | Weiss | ............................. | 600/424 |
| 2006/0173288 A1 * | 8/2006 | Eggers | .......................... | 600/424 |
| 2006/0281988 A1 * | 12/2006 | Weiss | ............................. | 600/423 |

* cited by examiner

*Primary Examiner* — Jonathan Cwern

(57) ABSTRACT

An MR process locates a medical instrument with an attached microcoil in the examination volume of an MR device. The microcoil is part of a resonant circuit matched to the resonant frequency of the MR device and having no external controls. At least two temporally successive high frequency pulses (RF) are generated within the examination volume. After each of the high frequency pulses (RF), frequency-coded MR signals ($S_1$, $S_2$) from the examination volume are recorded. The position of the medical instrument is determined by analyzing the differences between the recorded MR signals ($S_1$, $S_2$).

18 Claims, 2 Drawing Sheets

PROCESS FOR LOCATING A MEDICAL INSTRUMENT WITH A MICROCOIL

BACKGROUND

The invention relates to an MR process to locate a medical instrument with a microcoil attached thereto in the examination volume of an MR device.

The invention also relates to an MR device for performance of such a process and a computer program to implement such a process on an MR device.

In the field of interventional radiology, processes based on magnetic resonance (MR) are now becoming increasingly important. In contrast to radio diagnostics previously generally used in this field, magnetic resonance has the advantage that neither the patient nor the doctor performing the work is exposed to ionizing radiation. Also MR processes have the advantage of far better soft tissue contrast than processes of radio diagnostics.

For interventional radiological processes, the location of the interventional medical instruments used always plays a decisive role. These instruments can be for example intravascular catheters, biopsy needles, minimal invasive surgical instruments or similar. One important use of interventional radiology is angiography i.e. radiological processes to clarify the anatomical details of a patient's blood system. Angiographic MR processes are of particular interest for examining blood vessels by means of intravascular catheters which at their tips are equipped with special microcoils for the purposes of location.

U.S. Pat. No. 6,236,205 B1 discloses an MR-based process to locate a medical instrument with attached microcoil. In the previously known process, the microcoil is used as part of a resonant circuit which is tuned to the resonant frequency of the MR device used. The resonant circuit is influenced according to the previously known process via an optical control signal which is supplied to the resonant circuit via an optical fiber. In the previously known process first in the usual manner in the entire examination volume of the MR device a high frequency excitation is performed by means of one or more high frequency pulses. The high frequency radiation couples into the microcoil so that the resonant circuit is excited to resonance. The excited resonant circuit then in turn emits a high frequency signal which in the local environment of the microcoil amplifies the field intensity of the high frequency pulse. By temporal variation of the optical control signal supplied to the resonant circuit, according to the previously known process the resonant circuit is switched on and off alternately by means of an optically controllable impedance. As a result the high frequency signal emitted by the microcoil also varies temporally according to the control signal. As a result the components of the received MR signal arising from the local environment of the microcoil can be distinguished from the signal components arising from the other areas of the examination volume. In this way it is possible according to the previously known process to identify the microcoil in the MR images reconstructed from the recorded MR signals and hence determine the position of the medical instrument.

The disadvantage in the previously known process is that it requires a special hardware, namely the opto-electronics described above, to control the resonant circuit. Furthermore special signal processing and signal generation components are required which must be controllable by the central control unit of the MR device. Examples are a suitable light source and a modulator to modulate the light of the light source which is coupled into the optical fiber of the medical instrument. It is necessary for the modulator to be controllable by the central control unit of the MR device so that the temporal development of the inputted light signal can be controlled in synchrony with the generation of the high frequency pulse and the recording of the MR signal. These components do not form part of the standard equipment of MR devices normally present in clinical use. Disadvantageously, to operate such devices according to the previously known MR processes, a significant investment is required to adapt the hardware and software.

On this basis the object of the invention is to develop an MR process which allows particularly simple location of a medical instrument equipped with a microcoil without the hardware of the MR device used requiring any special adaptation.

This object is achieved by the invention an MR process to locate in the examination volume of an MR device a medical instrument with attached microcoil which is part of a resonant circuit tuned to the resonant frequency of the MR device and having no external controls, where at least two temporally successive high frequency pulses are generated within the examination volume and where frequency-coded MR signals are recorded after each of the high frequency pulses from the examination volume. The position of the medical instrument is determined according to the invention by analyzing differences between the MR signals recorded.

It is known that in MR processes, generating two or more temporally successive high frequency pulses causes the core magnetization within the examination volume to try to reach a steady state. In the steady state, the generation of transverse core magnetization by the high frequency pulse and the relaxation of core magnetization are balanced. The steady state is usually only achieved after irradiation of several high frequency pulses. In the steady state the MR signals recorded have more or less constant amplitude. Until the steady state is reached the MR signal amplitude can be subject to oscillation, where in particular the intensity of these oscillations or the speed with which the steady state is achieved depends on the rotary angles of the core magnetization allocated to the high frequency pulses. As described above, excitation of the resonant circuit by the high frequency pulses leads to an amplification of the high frequency fields in the local environment of the microcoil attached to the medical instrument. As a result the effective rotary angle of the high frequency pulses in the local environment of the microcoil is greater than in the other areas of the examination volume of the MR device. The core magnetization to a certain extent "senses" a greater rotary angle of the high frequency pulse in the vicinity of the microcoil than in the areas remote from the microcoil. The process is based on the knowledge that the steady state of core magnetization in the areas of the examination volume remote from the microcoil is achieved in a different way to that in the immediate local environment of the microcoil. Frequency-coded MR signals from the examination volume are recorded after each of the high frequency pulses. This is suitably done by means of a magnetic field gradient in a prespecified spatial direction. Because the transition to the steady state in the local environment of the microcoil is different from that in the other areas of the examination volume, according to the invention the position of the medical instrument can be determined by simple analysis of differences between the MR signals recorded.

An advantage of the process is that with a microcoil on a medical instrument, only one resonant circuit need be applied, where the resonant circuit is firmly tuned to the resonant frequency of the MR device. The resonant circuit constitutes a purely passive high frequency circuit which has no any external controls. It is possible to fit to a medical instrument, for example an intravascular catheter, a suitable resonant circuit which in the simplest case comprises a microcoil and capacitor connected parallel thereto, with minimum expense and cost. It is particularly advantageous that no additional hardware components of the MR device used are required. The MR process according to the invention can simply be performed with any normal MR device in clinical use.

Suitably in the process a difference signal can be determined by subtraction of the recorded MR signals so that the position of the medical instrument can be determined from the frequency spectrum of the difference signal. The differences between the recorded MR signals can be analyzed particularly well by means of the difference signal. The position of the medical instrument arises on the basis of frequency coding of the MR signals recorded directly from the frequency spectrum of the difference signal. The frequency spectrum of the difference signal constitutes to some extent a projection image of the examination volume on the co-ordinate axis prespecified by the frequency coding direction. By use of this process, by recording the MR signals in different frequency coding directions, the precise three-dimensional position of the medical instrument within the examination volume can be determined. In particular the movement of the medical instrument within the examination volume can also be followed in real time. This process advantageously works extremely quickly as it is not necessary to record a complete MR signal data set to reconstruct an MR image of the entire examination volume. Advantageously this process can be used for "slice-tracking" where the position and orientation of the image plane for an MR layer image are prespecified as a function of the determined position of the medical instrument.

Suitably in the MR process, the rotary angles of the core magnetization allocated to the high frequency pulses are clearly less than 90°. It is advantageously possible to select the rotary angles allocated to the high frequency pulses such that the amplitudes of the successively recorded MR signal components which are based on the excitation of core magnetization in the local environment of the microcoil attached to the medical instrument show significant differences while at the same time the amplitudes of the MR signal components recorded from the other areas of the examination volume are essentially constant. Consequently by suitable choice of the rotary angle the determination of the position of the medical instrument can be optimized by ensuring that the amplitude of the core magnetization on transition to steady state in the local environment of the microcoil oscillates greatly while the amplitude of the core magnetization in the areas remote from the microcoil remains more or less the same. For the reliable function of the MR process however the rotary angles of the high frequency pulses are selected so that the transition of core magnetization to the steady state in the environment of the medical instrument differs from that in the other areas of the examination volume.

The temporal spacing between the successively generated high frequency pulses is less than the longitudinal relaxation time of the core magnetization.

To perform the MR process according to the invention an MR device implements the process described above by a suitable program control of the central control unit and/or reconstruction and display unit.

The process can be made available to the users of such MR devices in the form of a corresponding computer program. The computer program can be stored on suitable data carriers such as for example CD-ROM or diskette or it can be downloaded via the internet into the control unit of the MR device.

BRIEF DESCRIPTION OF THE DRAWINGS

The invention will be further described with reference to examples of embodiments shown in the drawings, to which however the invention is not restricted.

These show.

DETAILED DESCRIPTION

Figure 1:
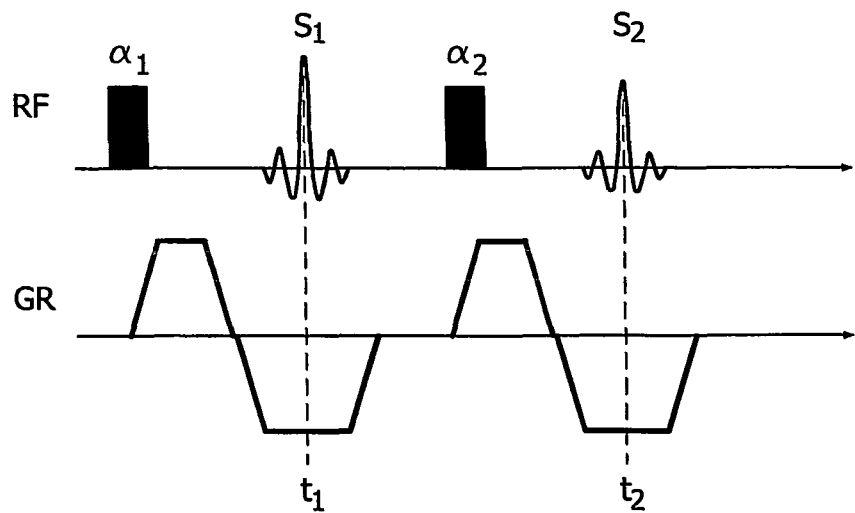
FIG. 1 sequence of high frequency pulses and switched magnetic field gradients according to the invention.

FIG. 1 shows the temporal sequence of high frequency pulses RF and switched magnetic field gradients GR for determining according to the invention the position of a medical instrument equipped with a microcoil. Allocated to the first high frequency pulse is a rotary or flip angle $\alpha_1$. The magnetic field gradient GR is switched in a prespecified spatial direction after generation of the first high frequency pulse so that at time $t_1$ a gradient echo is generated which is recorded as the MR signal $S_1$. Immediately thereafter a second high frequency pulse is generated with rotary or flip angle $\alpha_2$ where at time $t_2$ again a gradient echo is recorded as the MR signal $S_2$. The temporal spacing between the two high frequency pulses is clearly less than the longitudinal relaxation time of the core magnetization and the rotary angles $\alpha_1$, $\alpha_2$ are selected clearly less than 90°. From FIG. 1 it is clear that the MR signals $S_1$ and $S_2$ have clearly different amplitudes. By analyzing the differences between the recorded MR signals $S_1$ and $S_2$ according to the invention, the position of the medical instrument can be determined. The magnetic field gradient GR existing at times $t_1$ and $t_2$ causes a frequency coding of the recorded MR signals $S_1$ and $S_2$. Using the frequency coding, MR signal components based on the excitation of core magnetization in the local environment of the microcoil attached to the medical instrument can be distinguished from MR signal components based on the excitation of core magnetization in the other areas of the examination volume. For example a difference signal can be calculated by subtracting the recorded MR signals $S_1$ and $S_2$, where then the position of the medical instrument can be determined using the frequency spectrum of the difference signal. The frequency spectrum to a certain extent constitutes a one-dimensional projection image where the projection direction is prespecified by the direction of the magnetic field gradient GR.

Figure 2:
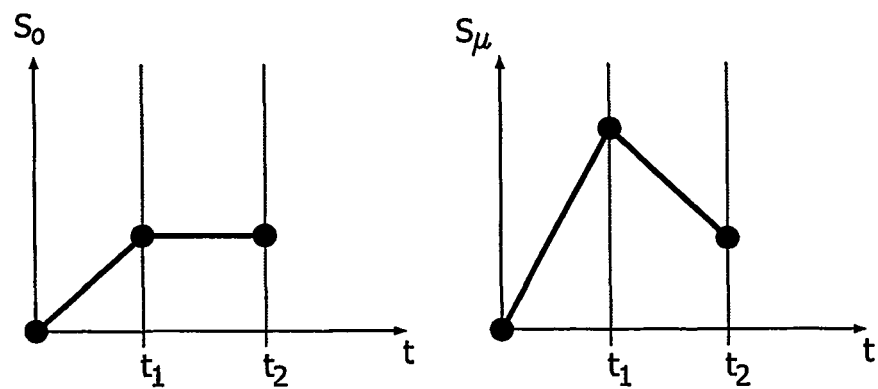
FIG. 2 diagram of amplitudes of the MR signals recorded according to the invention.

FIG. 2 shows as a function of time the amplitudes of the MR signal components $S_\mu$ recorded from the local environment of the microcoil and the MR signal components $S_0$ recorded from the other areas of the examination volume. Because as described above in the local environment of the magnetic coil the field intensity of the high frequency pulses is amplified, for core magnetization in this area an effectively greater rotary angle is required than is the case in the other areas within the examination volume. This leads to the MR signal components $S_\mu$ recorded at times $t_1$ and $t_2$ having significantly different amplitudes, while the amplitudes of the MR signal components $S_0$ are more or less constant. As is clear from FIG. 2, for core magnetization in the local environment of the microcoil, the transition to the steady state due to the pulse sequence shown in FIG. 1 differs from that in the areas of the examination volume remote from the microcoil. The position of the medical instrument is determined from these differences.

Figure 3:
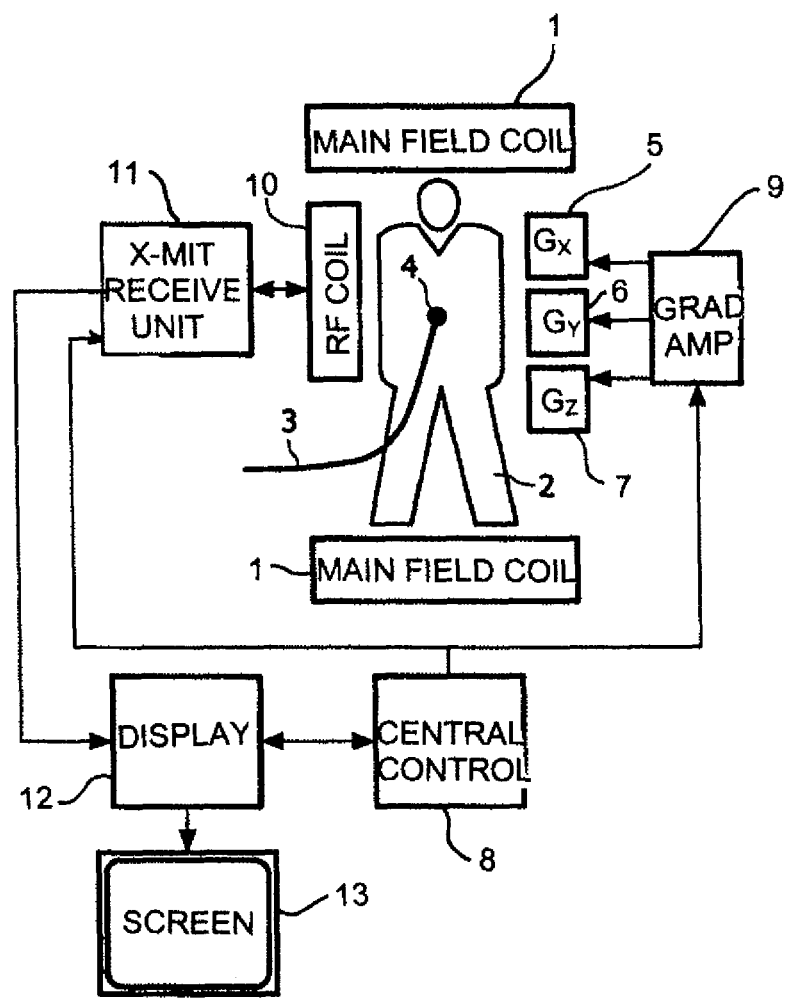
FIG. 3 MR device according to the invention.

FIG. 3 shows an MR device according to the invention as a block diagram. The device comprises a main field coil 1 to generate a homogeneous static magnetic field in an examination volume containing a patient 2. In the patient is a medical instrument 3, namely an intravascular catheter, to which a microcoil 4 is attached. The microcoil 4 is part of a resonant circuit not shown in more detail in FIG. 3 which is tuned to the resonant frequency of the MR device. For performance of the process according to the invention the resonant circuit has no external controls. The MR device shown has furthermore gradient coils 5, 6 and 7 to generate magnetic field gradients in different spatial directions within the examination volume. By means of a central control unit 8 connected via a gradient amplifier 9 with the gradient coils 5, 6 and 7, the temporal development of the magnetic field gradient is controlled within the examination volume. The MR device shown further includes a high frequency coil 10 to generate high frequency fields in the examination volume and to record MR signals from the examination volume. The high frequency coil 10 is connected via a transmitter/receiver unit 11 with the central control unit 8 and with a reconstruction and display unit 12 respectively. The MR signals processed by the reconstruction and display unit 12 can be displayed by means of a screen 13. The central control unit 8 and/or the reconstruction and display unit 12 of the MR device has a programmable control by means of which the MR process described above can be implemented on any MR device.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. An MR process to locate in the examination volume of an MR device a medical instrument with a microcoil attached thereto which is part of a resonant circuit that is non-switchably tuned to the resonant frequency of the MR device and having no external controls, with the following process steps:
    generating a plurality of temporally successive RF pulses within the examination volume, a temporal spacing between successive RF pulses being less than a longitudinal relaxation time of core magnetization such that the core magnetization is driven toward a steady state in which the generation and relaxation of the core magnetization are balanced, the microcoil causing the core magnetization in tissue adjacent the microcoil to approach the steady state in tissue differently than in tissue displaced from the microcoil;
    before the core magnetization reaches the steady state, applying a magnetic field gradient pulse in a first direction after an earlier RF pulse to generate a first gradient echo signal frequency encoded in the first direction, wherein the generating of the plurality of RF pulses and the generating of the first and second gradient echoes are performed without altering the resonance frequency of the microcoil resonant circuit;
    when the core magnetization has been driven closer to the steady state, re-applying the magnetic field gradient pulse in the first direction after a subsequent RF pulse to generate a second gradient echo signal frequency encoded in the first direction;
    subtracting the first and second gradient echo signals to generate a difference signal;
    determining a position of the medical instrument in the first direction by analysis of the difference signal.

2. The MR process as claimed in claim 1, wherein the determination of the position includes:
    determining the position in the first direction of the medical instrument from a frequency spectrum of the difference signal.

3. The MR process as claimed in claim 1, wherein rotary angles allocated to the RF pulses are less than 90°.

4. The MR process as claimed in claim 1, wherein rotary angles allocated to the RF pulses are also selected such that amplitudes of components of the first and second gradient echo signals which are based on excitation of the core magnetization in the tissue in the examination volume displaced from the microcoil are essentially constant.

5. The MR process as claimed in claim 1, further including:
    applying magnetic field gradients along second and third directions to generate gradient echo signals which are frequency encoded in the second and third directions.

6. The process as claimed in claim 1, wherein the microcoil remains in a common, fixed resonance mode during the generating steps.

7. An MR device with a main field coil to generate an essentially homogeneous static magnetic field in an examination volume, a multiplicity of gradient coils to generate magnetic field gradients in the examination volume, a high frequency coil to generate high frequency fields in the examination volume and to record MR signals from the examination volume, a medical instrument with a non-switchable microcoil attached thereto, a central control unit to control the gradient coils and the high frequency coil, and a reconstruction and display unit to process and display the recorded MR signals, wherein the control unit and/or the reconstruction and display unit has a program control by means of which an MR process as claimed in claim 1 can be implemented on the MR device.

8. The MR device as claimed in claim 7, wherein the microcoil is part of a resonant circuit which is non-switchably tuned to the resonant frequency of the MR device, which circuit has no connection to any of the other components of the MR device.

9. A non-transitory computer readable medium programmed with a computer program for controlling a processor to control an MR device to perform the MR process as claimed in claim 1.

10. An MR method for locating in an examination region of an MR device a medical instrument which has a microcoil resonance circuit which is non-switchably tuned to a resonance frequency of the MR device, the method comprising:
    generating a series of RF pulses with rotary angles less than 90° to transition core magnetization toward a steady state, the microcoil resonance circuit tuned to the MR device resonance frequency causing the core magnetization in an environment of the microcoil resonance circuit to experience a greater rotary angle than in areas remote from the microcoil resonance circuit such that the core magnetization transitions to the steady state differently in the environment of the microcoil resonance circuit than in areas remote from the microcoil resonance circuit, the microcoil remaining in a common, fixed resonance mode during the generating;
    reading out first MR signals which are frequency encoded in a first frequency encoding direction after a first RF pulse of the RF pulse series;
    reading out second MR signals which are frequency encoded in the first frequency encoding direction after a subsequent RF pulse of the RF pulse series;
    analyzing the first and second MR signals based on differences in the transitioning of the core magnetization toward the steady state in the areas remote from the microcoil resonance circuit and in the environment of the microcoil resonance circuit to determine the location of the microcoil resonance circuit.

11. The method as claimed in claim 10, wherein applying the series of RF pulses includes:
generating the first RF pulse with a first rotary angle with the microcoil resonance circuit tuned to the MR device resonance frequency;
generating the second RF pulse with a second rotary angle with the microcoil resonance circuit tuned to the MR device resonance frequency;
the first and second rotary angles being such that amplitudes of components of the first and second MR signals from the areas remote from the microcoil resonance circuit are essentially constant and amplitudes of components of the first and second MR signals in the environment of the microcoil resonance circuit are different.

12. The method as claimed in claim 11, wherein the analyzing includes:
subtracting the first and second MR signals.

13. The method as claimed in claim 12, further including:
applying gradients in the first frequency encoding direction during the reading out of the first and second MR signals.

14. The method as claimed in claim 13, wherein the first and second MR signals are gradient echo signals.

15. An MR apparatus including a processor programmed to perform the method of claim 10.

16. A method of locating a microcoil attached to a medical device in a magnetic resonance imaging system, the microcoil being part of a resonance circuit non-switchably tuned to a resonance frequency of the magnetic resonance imaging system, the method comprising:
applying a series of RF pulses with the resonance circuit tuned to the resonance frequency to drive core magnetization in an object in an examination volume towards a steady-state, regions of the object adjacent the microcoil transitioning to the steady-state differently than regions of the object displaced from the microcoil;
after first and second RF pulses of the series of RF pulses, the first and second RF pulses both applied with the resonance circuit tuned to the common resonance frequency, inducing first and second gradient echoes by applying gradient pulses along a selected direction, the first and second gradient both being induced while the resonance circuit remains tuned to the resonance frequency;
reading out first and second gradient echo signals during the first and second gradient echoes, such that position along the selected direction is frequency-encoded in the echo signals while the resonance circuit remains tuned to the resonance frequency;
subtracting the first and second echo signals to generate a difference signal, the difference signal having higher amplitude frequency components corresponding to the region of the object adjacent the microcoil and lower amplitude components in the regions of the object displaced from the microcoil;
determining a location of the microcoil along the selected direction from the difference signal.

17. A magnetic resonance imaging system comprising:
a main field coil which generates a core magnetization in an examination volume;
a gradient coil system which generates magnetic field gradients in selected directions across the examination volume;
an RF coil system which applies RF pulses to the examination volume and receives magnetic resonance signals from the examination volume;
a medical instrument which includes a microcoil connected in a resonance circuit;
a control unit which controls the gradient coil system and the RF coil system to perform the method of claim 16.

18. A non-transitory computer readable medium programmed with software code which, when implemented on a computer in a control unit of a magnetic resonance device, controls the magnetic resonance device to perform the method as claimed in claim 16.

* * * * *